United States Patent
Shah et al.

(10) Patent No.: US 10,221,483 B2
(45) Date of Patent: Mar. 5, 2019

(54) SHOWERHEAD DESIGN

(71) Applicant: Applied Materials, Inc., Santa Clara, CA (US)

(72) Inventors: Kartik Shah, Sunnyvale, CA (US); Chaitanya A. Prasad, Bangalore (IN); Kevin Joseph Bautista, San Jose, CA (US); Jeffrey Tobin, Mountain View, CA (US); Umesh M. Kelkar, Santa Clara, CA (US); Lara Hawrylchak, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 342 days.

(21) Appl. No.: 14/691,496

(22) Filed: Apr. 20, 2015

(65) Prior Publication Data

US 2015/0329966 A1    Nov. 19, 2015

Related U.S. Application Data

(60) Provisional application No. 61/994,584, filed on May 16, 2014.

(51) Int. Cl.
| | | |
|---|---|---|
| *C23C 16/455* | (2006.01) | |
| *C23C 16/458* | (2006.01) | |
| *H01L 21/67* | (2006.01) | |

(52) U.S. Cl.
CPC ...... *C23C 16/45565* (2013.01); *C23C 16/458* (2013.01); *C23C 16/4584* (2013.01); *H01L 21/67115* (2013.01)

(58) Field of Classification Search
CPC .......... C23C 16/45565; C23C 16/4584; C23C 16/458; H01L 21/67115

(Continued)

(56) References Cited

U.S. PATENT DOCUMENTS 5,595,606 A * 1/1997 Fujikawa .......... C23C 16/45561
                                                118/715
5,871,586 A * 2/1999 Crawley ........... C23C 16/45514
                                                118/715

(Continued)

FOREIGN PATENT DOCUMENTS

JP          05175135 A  *  7/1993
TW        201338024 A      9/2013

OTHER PUBLICATIONS

PCT international search report of PCT/US2015/026687 dated Jun. 30, 2015.
Taiwan Office Action for Application No. 104113077 dated Oct. 15, 2018.

*Primary Examiner* — Rudy Zervigon
(74) *Attorney, Agent, or Firm* — Patterson + Sheridan LLP (57) ABSTRACT

Embodiments described herein relate to a showerhead having a reflector plate with a gas injection insert for radially distributing gas. In one embodiment, a showerhead assembly includes a reflector plate and a gas injection insert. The reflector plate includes at least one gas injection port. The gas injection insert is disposed in the reflector plate, and includes a plurality of apertures. The gas injection insert also includes a baffle plate disposed in the gas injection insert, wherein the baffle plate also includes a plurality of apertures. A first plenum is formed between a first portion of the baffle plate and the reflector plate, and a second plenum is formed between a second portion of the baffle plate and the reflector plate. The plurality of apertures of the gas injection insert and the plurality of apertures of the baffle plate are not axially aligned.

11 Claims, 5 Drawing Sheets

(58) Field of Classification Search
USPC .................. 118/715; 156/345.33, 345.34
See application file for complete search history.

(56) References Cited

U.S. PATENT DOCUMENTS

| | | | | |
|---|---|---|---|---|
| 5,884,009 | A * | 3/1999 | Okase | H01L 21/67017 219/405 |
| 5,950,925 | A * | 9/1999 | Fukunaga | C23C 16/45512 118/715 |
| 5,992,453 | A * | 11/1999 | Zimmer | B05C 1/10 137/561 A |
| 6,059,885 | A * | 5/2000 | Ohashi | C23C 16/4401 118/715 |
| 6,086,677 | A * | 7/2000 | Umotoy | C23C 16/45514 118/715 |
| 6,089,472 | A * | 7/2000 | Carter | C23C 16/455 239/422 |
| 6,121,579 | A * | 9/2000 | Aoki | C23C 16/481 118/730 |
| 6,132,512 | A * | 10/2000 | Horie | C23C 16/45565 118/715 |
| 6,245,192 | B1 * | 6/2001 | Dhindsa | C23C 16/455 156/345.34 |
| 6,302,964 | B1 * | 10/2001 | Umotoy | C23C 16/45514 118/715 |
| 6,364,949 | B1 * | 4/2002 | Or | C23C 16/4412 118/69 |
| 6,368,987 | B1 * | 4/2002 | Kopacz | C23C 16/45514 118/723 E |
| 6,399,484 | B1 * | 6/2002 | Yamasaki | C23C 16/0281 257/E21.168 |
| 6,415,736 | B1 | 7/2002 | Hao et al. | |
| 6,499,425 | B1 * | 12/2002 | Sandhu | C23C 16/34 118/723 E |
| 6,502,530 | B1 * | 1/2003 | Turlot | C23C 16/455 118/723 E |
| 6,946,033 | B2 * | 9/2005 | Tsuei | C23C 16/45565 118/715 |
| 7,449,220 | B2 * | 11/2008 | Buechel | C23C 16/45565 427/569 |
| 7,481,886 | B2 * | 1/2009 | Kato | C23C 16/455 118/715 |
| 7,572,337 | B2 * | 8/2009 | Rocha-Alvarez | C23C 16/4405 118/715 |
| 7,622,005 | B2 * | 11/2009 | Balasubramanian | C23C 16/4405 118/715 |
| 7,661,388 | B2 * | 2/2010 | Schmitt | C23C 16/4583 118/723 E |
| 7,708,859 | B2 * | 5/2010 | Huang | C23C 16/45561 118/715 |
| 7,965,927 | B2 * | 6/2011 | Yokouchi | H01L 21/67115 392/407 |
| 8,038,835 | B2 * | 10/2011 | Hayashi | H01J 7/3244 118/715 |
| 8,088,248 | B2 * | 1/2012 | Larson | C23C 16/45561 156/345.33 |
| 8,111,978 | B2 * | 2/2012 | Sorabji | C23C 16/4404 392/416 |
| 8,349,083 | B2 * | 1/2013 | Takasuka | C23C 16/4401 118/715 |
| 8,349,403 | B2 * | 1/2013 | Takasuka | C23C 16/4401 118/715 |
| 8,475,625 | B2 * | 7/2013 | Pamarthy | H01J 37/3244 118/715 |
| 8,628,616 | B2 * | 1/2014 | Takasuka | C23C 16/4401 118/715 |
| 8,771,418 | B2 * | 7/2014 | Je | C23C 16/45565 118/715 |
| 8,882,913 | B2 * | 11/2014 | Byun | C23C 16/40 118/715 |
| 8,960,235 | B2 * | 2/2015 | Carlson | C23C 16/45565 118/715 |
| 8,986,493 | B2 * | 3/2015 | Tahara | H01J 37/32935 118/715 |
| 9,045,828 | B2 * | 6/2015 | Turlot | C23C 16/455 |
| 9,057,128 | B2 * | 6/2015 | Olgado | C23C 16/45565 |
| 9,112,088 | B2 * | 8/2015 | Niira | C23C 16/45565 |
| 9,117,635 | B2 * | 8/2015 | Satoh | H01J 37/3244 |
| 9,121,097 | B2 * | 9/2015 | Mohn | H01J 37/3244 |
| 9,315,897 | B2 * | 4/2016 | Byun | C23C 16/45572 |
| 9,396,909 | B2 * | 7/2016 | Carlson | C23C 16/45565 |
| 9,399,228 | B2 * | 7/2016 | Breiling | B05B 1/005 |
| 9,416,450 | B2 * | 8/2016 | Nguyen | C23C 16/44 |
| 9,441,295 | B2 * | 9/2016 | Rozenzon | C23C 16/45561 |
| 9,441,296 | B2 * | 9/2016 | Sabri | C23C 16/45565 |
| 9,466,468 | B2 * | 10/2016 | Okayama | H01J 37/3244 |
| 9,587,312 | B2 * | 3/2017 | Silva | C23C 16/301 |
| 9,714,465 | B2 * | 7/2017 | Tsuei | C23C 16/45559 |
| 9,758,868 | B1 * | 9/2017 | Breiling | C23C 16/4408 |
| 2001/0027026 | A1 | 10/2001 | Dhindsa et al. | |
| 2002/0017243 | A1 * | 2/2002 | Pyo | C23C 16/18 118/715 |
| 2003/0019580 | A1 * | 1/2003 | Strang | C23C 16/45565 156/345.33 |
| 2004/0029379 | A1 * | 2/2004 | Yamasaki | C23C 16/0218 438/685 |
| 2004/0050326 | A1 * | 3/2004 | Thilderkvist | C23C 16/45561 118/715 |
| 2004/0050492 | A1 * | 3/2004 | Tsuei | C23C 16/45565 156/345.33 |
| 2004/0052969 | A1 * | 3/2004 | Lee | C23C 16/4405 427/535 |
| 2004/0134611 | A1 * | 7/2004 | Kato | C23C 16/455 156/345.33 |
| 2004/0191413 | A1 * | 9/2004 | Park | C23C 16/45527 427/255.28 |
| 2004/0209487 | A1 * | 10/2004 | Choi | H01L 21/02164 438/788 |
| 2006/0174827 | A1 * | 8/2006 | Bae | C23C 16/45563 117/200 |
| 2008/0078746 | A1 * | 4/2008 | Masuda | H01J 37/3244 216/79 |
| 2008/0081114 | A1 * | 4/2008 | Johanson | C23C 16/45565 427/273 |
| 2008/0093341 | A1 * | 4/2008 | Turlot | C23C 16/455 216/71 |
| 2008/0236495 | A1 | 10/2008 | Tompa | |
| 2009/0000743 | A1 * | 1/2009 | Iizuka | H01J 7/32091 156/345.34 |
| 2009/0095221 | A1 * | 4/2009 | Tam | C23C 16/34 118/715 |
| 2009/0148704 | A1 * | 6/2009 | Takasuka | C23C 16/4401 428/411.1 |
| 2009/0155997 | A1 | 6/2009 | Shinriki et al. | |
| 2009/0169744 | A1 * | 7/2009 | Byun | C23C 16/40 427/255.28 |
| 2009/0211707 | A1 * | 8/2009 | Chao | C23C 16/45565 156/345.34 |
| 2010/0008656 | A1 * | 1/2010 | Sorabji | C23C 16/4404 392/416 |
| 2010/0096367 | A1 * | 4/2010 | Jeon | H01J 7/32082 219/121.36 |
| 2010/0136216 | A1 * | 6/2010 | Tsuei | C23C 16/45559 427/9 |
| 2011/0048325 | A1 * | 3/2011 | Choi | C23C 16/452 118/712 |
| 2011/0061810 | A1 * | 3/2011 | Ganguly | H01L 21/0223 156/345.27 |
| 2011/0061812 | A1 * | 3/2011 | Ganguly | H01L 21/0223 156/345.34 |
| 2011/0065276 | A1 * | 3/2011 | Ganguly | H01L 21/0223 438/694 |
| 2011/0253044 | A1 * | 10/2011 | Tam | C23C 16/45519 118/666 |
| 2011/0277690 | A1 * | 11/2011 | Rozenzon | C23C 16/45561 118/723 MW |

(56) References Cited

U.S. PATENT DOCUMENTS

| | | | |
|---|---|---|---|
| 2012/0135145 A1* | 5/2012 | Je .................. | C23C 16/45565 427/248.1 |
| 2013/0040414 A1* | 2/2013 | Niira ................ | C23C 16/45565 438/57 |
| 2013/0108788 A1* | 5/2013 | Takasuka ............ | C23C 16/4401 427/248.1 |
| 2013/0109159 A1* | 5/2013 | Carlson ............. | C23C 16/45565 438/503 |
| 2014/0061324 A1 | 3/2014 | Mohn et al. | |
| 2014/0179114 A1* | 6/2014 | van Schravendijk ........................ | C23C 16/455 438/758 |
| 2014/0291286 A1* | 10/2014 | Okayama ............ | H01J 37/3244 216/37 |
| 2015/0000594 A1* | 1/2015 | Byun .................. | C23C 16/40 118/715 |
| 2015/0122357 A1* | 5/2015 | Carlson ............. | C23C 16/45565 137/599.01 |
| 2015/0155190 A1* | 6/2015 | Miller ............... | H01L 21/67115 438/14 |
| 2015/0233016 A1* | 8/2015 | Brillhart ................. | C30B 25/14 222/3 |
| 2015/0329966 A1* | 11/2015 | Shah ................ | C23C 16/45565 118/730 |
| 2015/0348755 A1* | 12/2015 | Han .................... | H01J 37/3244 118/723 IR |
| 2016/0033070 A1* | 2/2016 | Brillhart ............. | C23C 16/4412 137/565.01 |
| 2016/0068955 A1* | 3/2016 | Brillhart ........... | C23C 16/45565 118/728 |

\* cited by examiner

SHOWERHEAD DESIGN

CROSS-REFERENCE TO RELATED APPLICATIONS

This application claims priority from U.S. Provisional Application Ser. No. 61/994,584, filed May 16, 2014, which is hereby incorporated by reference in its entirety.

BACKGROUND OF THE DISCLOSURE

Field of the Disclosure

Embodiments of the present disclosure generally relate to a showerhead design having a reflector plate with a gas injection insert for radially distributing gas.

Description of the Related Art

Semiconductor substrates are processed for a wide variety of applications, including the fabrication of integrated devices and microdevices. One method of processing substrates includes depositing oxygen radicals on an upper surface of the substrate. For example, Applied Materials, Inc., of Santa Clara, Calif., offers a RadOx® process that heats the substrate with lamps and injects hydrogen and oxygen into a processing chamber. The gases form radicals when they strike the surface of the substrate to form a layer on the substrate, e.g., oxygen radicals form a silicon dioxide layer on a silicon substrate.

Current processing chamber showerheads used for radical oxygen deposition on 300 mm substrates have limited deposition control, resulting in poor processing uniformity. For example, low processing chamber pressure requirements for radial oxygen deposition and current showerhead designs result in gas reaching the substrate at a high velocity. The high velocity of the gas causes impingement on the substrate and prevents the gas from being adequately heated. On the other hand, oxygen radicals generated from combustion quickly recombine to create a short life cycle for the oxygen radicals. Therefore, the limited deposition control due to the high velocity of the gas combined with the short life cycle of oxygen radicals results in greater deposition at the center of the substrate, and poor deposition at the edges of the substrate.

Therefore, there is a need for an improved showerhead design that provides deposition control for more uniform deposition throughout the substrate, i.e., from the center to the edge.

SUMMARY OF THE DISCLOSURE

In one embodiment, a shower head assembly is disclosed herein. The showerhead assembly includes a reflector plate and a gas injection insert. The reflector plate has at least one gas injection port disposed therethrough. The gas injection insert is disposed in the reflector plate. The gas injection insert has a plurality of apertures. The gas injection insert includes a baffle plate. The baffle plate is disposed in the gas injection insert. The baffle plate has a plurality of apertures. A first plenum is formed between a first portion of the baffle plate and the reflector plate. A second plenum is formed between a second portion of the baffle plate and the reflector plate. The plurality of apertures of the gas injection insert and the plurality of apertures of the baffle plate are not axially aligned.

In another embodiment a processing chamber is disclosed herein. The processing chamber includes a substrate support and a showerhead assembly. The substrate support is configured to rotate a substrate during processing. The showerhead assembly is disposed above the substrate support. The showerhead assembly includes a reflector plate and a gas injection insert. The reflector plate has a first gas injection port a second gas injection port disposed therethrough. The gas injection insert is disposed in the reflector plate. The gas injection insert has a plurality of apertures. The gas injection insert includes at least two baffle plates radially disposed in the gas injection insert about a center of the reflector plate. Each baffle plate has a plurality of apertures. A first plenum is formed between a first portion of the baffle plate and the reflector plate. A second plenum is formed between a second portion of the baffle plate and the reflector plate. The first plenum is separated from the second plenum by a wall of the reflector plate. The plurality of apertures of the gas injection insert and the baffle plate are not axially aligned.

In yet another embodiment, a showerhead assembly is disclosed herein. The showerhead assembly includes a reflector plate and a gas injection insert. The reflector plate has a first injection port and a second gas injection port disposed therethrough to deliver gas to a first plenum and a second plenum. The gas injection insert is disposed in the reflector plate, below the first and second plenums. The gas injection insert includes a plurality of apertures. The number and size of the apertures is selected based on the flow rate of gas flowing through the first and second gas injection ports. The gas injection insert includes a baffle plate disposed in the gas injection insert. The baffle plate is exposed to the first and second plenums. The baffle plate is configured to reduce the flow of rate of gas flowing through the first and second plenums.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
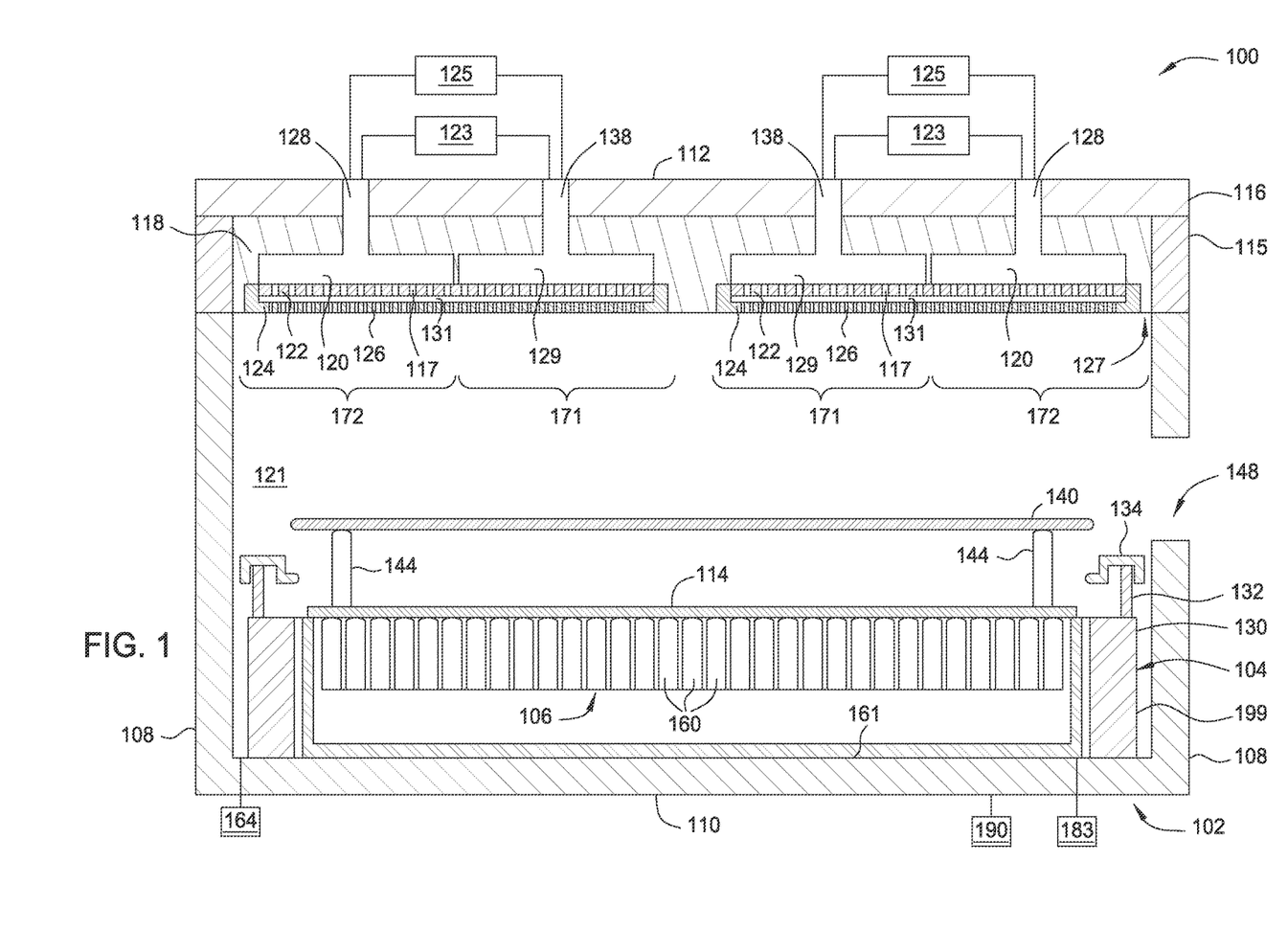
FIG. 1 is a schematic view of a processing chamber according to one embodiment of the disclosure.

FIG. 1 illustrates a schematic view of a rapid thermal processing chamber 100 according to one embodiment of the disclosure. Although details of the disclosure are described as utilized within a rapid thermal processing chamber, embodiments described herein may be utilized in other processing systems and devices where uniform deposition is desired, such as other deposition chambers and etch chambers.

The processing chamber 100 includes a contactless or magnetically levitated substrate support 104 and a chamber body 102. The chamber body 102 has sidewalls 108, a bottom wall 110, and a top wall 112. The sidewalls 108, bottom wall 110, and top wall 112 define an interior volume 121. The top wall 112 includes a lid 116 having a showerhead assembly 127. The sidewalls 108 typically include at least one substrate access port 148. The substrate access port 148 facilitates entry and egress of a substrate 140. The processing chamber 100 may also include a radiant heat source 106 disposed in an inside diameter of the substrate support 104.

The substrate support 104 is adapted to magnetically levitate and rotate a substrate (not shown) within the interior volume 121. The substrate support 104 includes an annular body 199. The annular body 199 includes a magnetic ring section 130 and a substrate support section 132. The support section 132 extends from an upper surface of the magnetic ring section 130 to support a support ring 134. The support ring 134 facilities alignment and provides a seating surface for the substrate 140.

The processing chamber 100 also includes a window 114 made from a material transparent to heat and light of various wavelengths. The various wavelengths may include light in the infra-red (IR) spectrum, through which photons from a radiant heat source 106 may heat the substrate 140. The window 114 may also include a plurality of lift pins 144. The lift pins 144 are adapted to selectively contact and support the substrate 140 to facilitate transfer of the substrate 140 into and out of the processing chamber 100.

In one embodiment, the radiant heat source 106 includes a lamp assembly formed from a housing. The housing includes a plurality of honeycomb tubes 160 in a coolant assembly 161. The honeycomb tubes 160 are coupled to a coolant source 183.

An atmosphere control system 164 is also coupled to the interior volume 121 of the chamber body 102. The atmosphere control system 164 generally includes throttle valves and vacuum pumps for controlling chamber pressure.

The showerhead assembly 127 is configured to deliver one or more gases to the substrate 140. The showerhead assembly 127 includes a reflector plate 118 disposed below the lid 116. The reflector plate 118 faces the substrate support 104. The reflector plate 118 is configured to reflect IR light that is radiating off the substrate 140 back onto the substrate 140. A cooling plate 115 may optionally be disposed around and circumscribe the reflector plate 118 to cool the reflector plate 118.

In one embodiment, the showerhead assembly 127 includes at least a first gas injection port 138 and a second gas injection port 128 formed through the lid 116 and the reflector plate 118. An enlarged schematic view of the first gas injection port 138 and the second gas injection port 128 of the showerhead assembly 127 may be seen in FIG. 2A. The first gas injection port 138 is configured to inject gas from a first gas source 123 to a first plenum 129 in a generally radially inward direction. The second gas injection port 128 is configured to inject gas from a second gas source 125 to a second plenum 120 in a generally radially inward direction. The first and second plenums 129, 120 are formed in the reflector plate 118. The first plenum 129 is exposed to the first gas injection port 138. The second plenum 120 is exposed to the second gas injection port 128.

Figure 2A:
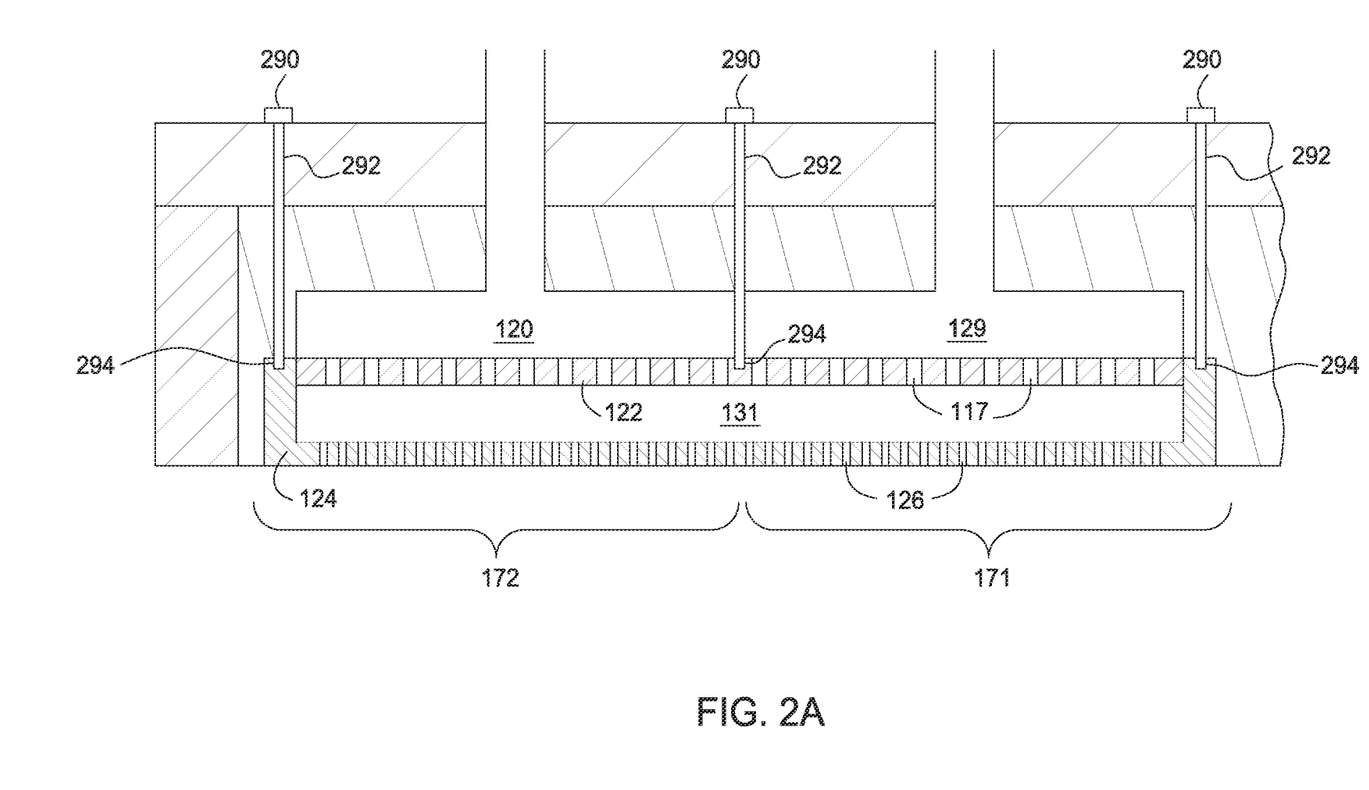
FIG. 2A illustrates an enlarged view of a showerhead assembly, according to one embodiment of the disclosure.

In one embodiment, the first gas injection port 138 (for providing gas to the first plenum 129) is located in the second quarter of the reflector plate 118. For example, the first gas injection port 138 is located between about 30 mm to about 40 mm from the center of the reflector plate 118. In one embodiment, the second gas injection port 128 (for providing gas to the second plenum 120) is located in the first quarter of the reflector plate 118. For example, the second gas injection port 128 is located between about 112 mm to about 122 mm from the center of the reflector plate 118. In one embodiment, the first and second gas injection ports 138, 128 each have a diameter of between about 1 mm and about 10 mm, for example, about 5 mm or about 5.1 mm.

In one embodiment, the first gas source 123 supplies oxygen gas ($O_2$) and the second gas source 125 supplies hydrogen gas ($H_2$). An oxygen and hydrogen gas mixture ($O_2/H_2$) is thus supplied to the first and second plenums 129, 120. In one embodiment, the gas mixture is between about 23 percent to about 43 percent hydrogen gas, and between about 57 percent to about 77 percent oxygen gas, for example, about 33 percent hydrogen gas and about 67 percent oxygen gas. The gas mixture flowing through the first plenum 129 forms an inner zone 171 in the showerhead assembly 127. The gas mixture flowing through the second plenum 120 forms an outer zone 172 in the showerhead assembly 127. The separate and distinct inner and outer zones 171, 172 in the showerhead assembly 127 advantageously allow the gas mixture to be controlled and tuned prior to being deposited on the substrate 140, depending on the processing requirements.

Figure 3:
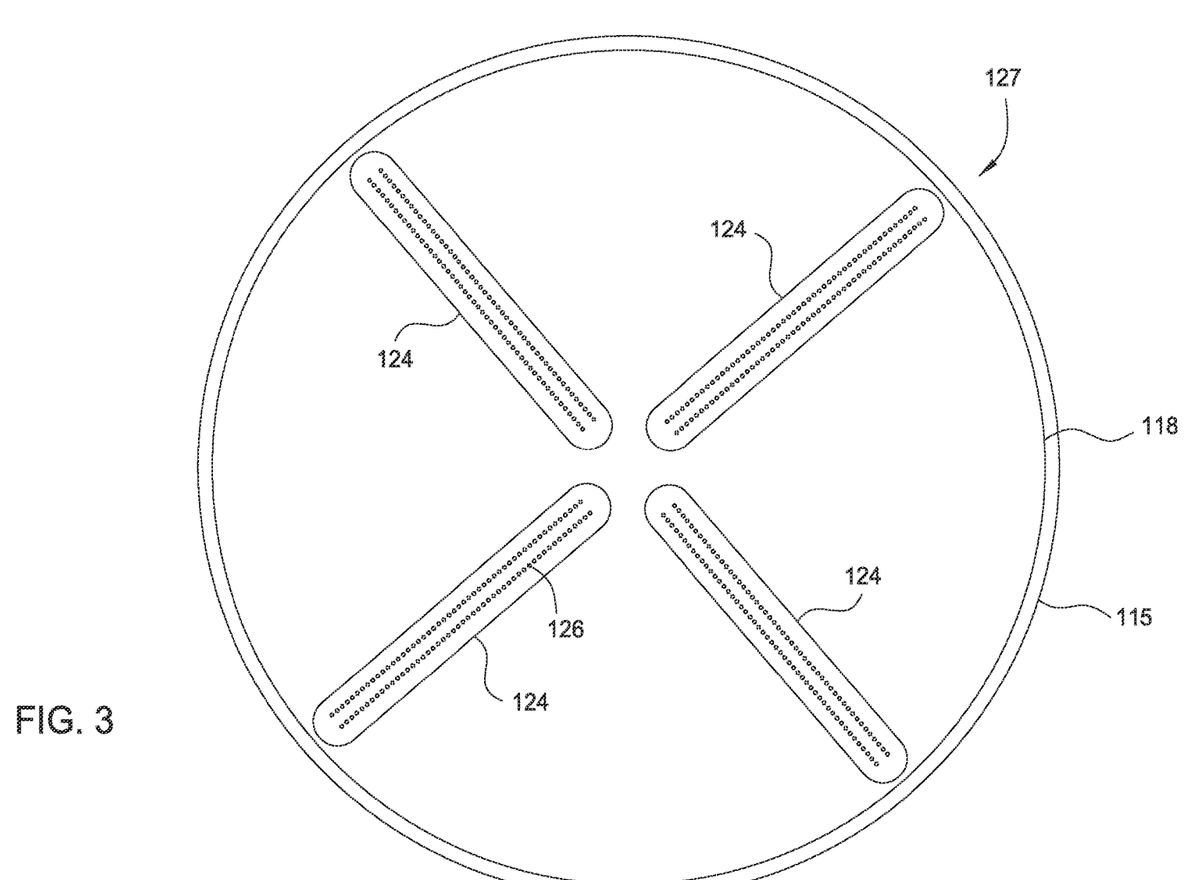
FIG. 3 illustrates an enlarged bottom view of a reflector plate according to one embodiment of the disclosure.

The reflector plate 118 also includes one or more gas injection inserts 124 disposed in the reflector plate 118. FIG. 3 illustrates an enlarged bottom view of the reflector plate 118. In one embodiment, the reflector plate 118 includes one gas injection insert 124, two gas injection inserts 124, each located about every 180 degrees around the reflector plate 118 (as shown in FIG. 1), or four gas injection inserts 124, located about every 90 degrees around the reflector plate 118 (as shown in FIG. 3). The baffle plate 122 is coupled to the reflector plate 118 by a plurality of screws 290. The plurality of screws are configured to fit within a plurality of screw holes 292 formed in the reflector plate 118 and a plurality of screw holes 294 formed in the baffle plate 122.

Figure 2B:
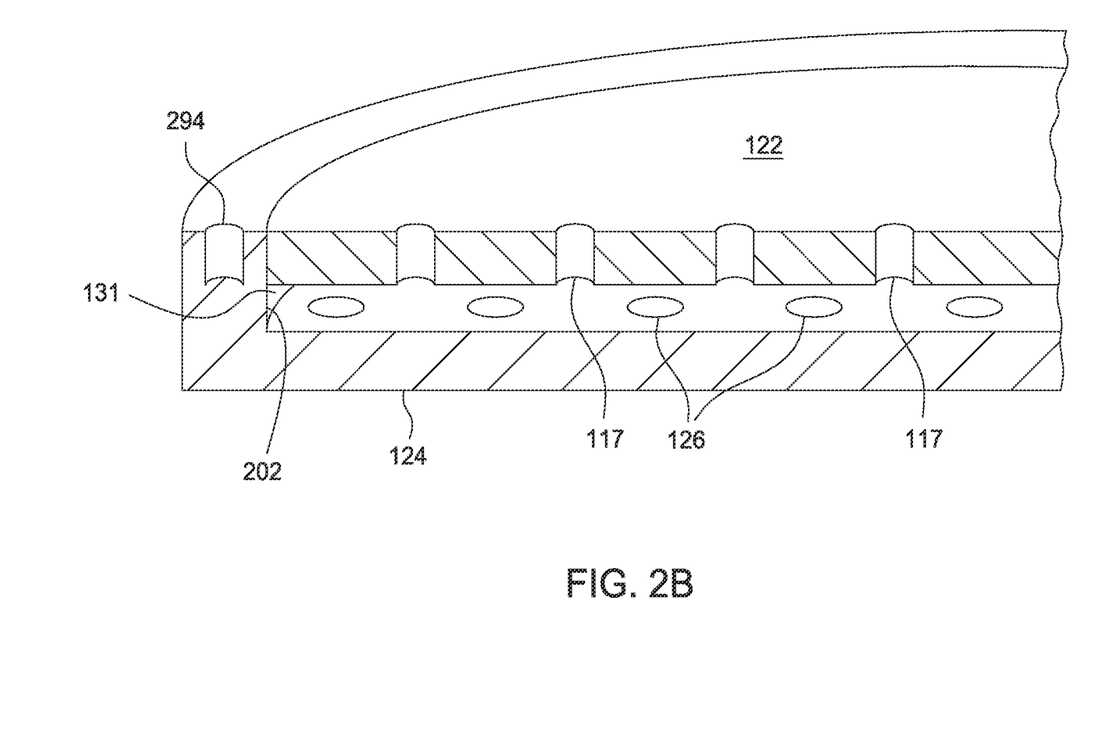
FIG. 2B illustrates a cross-sectional enlarged view of a baffle plate with a gas injection insert disposed therein, according to one embodiment of the disclosure.
Figure 4:
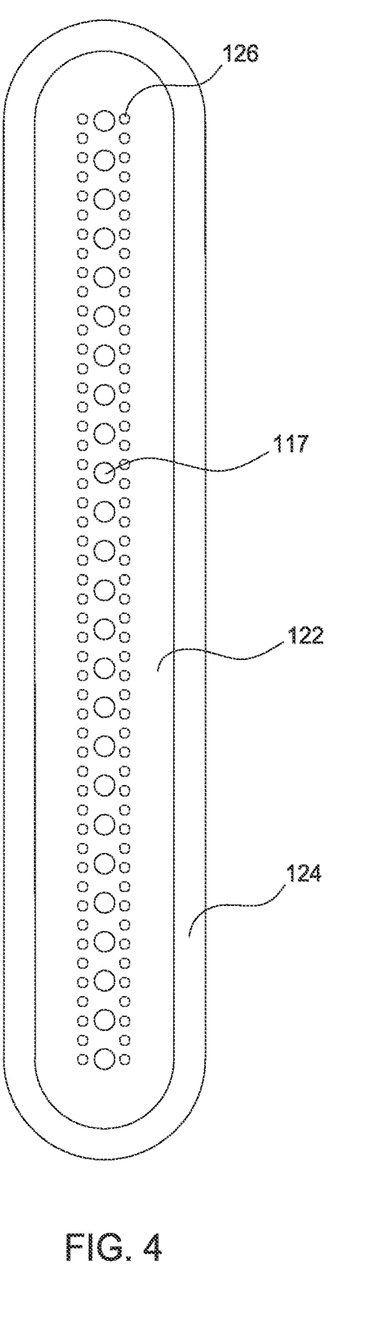
FIG. 4 illustrates an enlarged top view of a gas injection insert according to one embodiment of the disclosure.

FIG. 2B illustrates a cross-sectional view of a portion of the baffle plate 122 and the gas injection insert 124. The baffle plate 122 is shown coupled to an inner edge 202 of the gas injection insert 124. For example, in one embodiment, the baffle plate 122 may be welded to the inner edge 202 of the gas injection insert 124. The baffle plate 122 is suspended in the gas injection insert 124 such that the third plenum 131 is formed between the baffle plate 122 and the gas injection insert 124. The apertures 117 in the baffle plate 122 are shown to be not be axially aligned with the apertures 126 formed in the gas injection insert 124 such that a tortuous flow path is formed from the first and second plenums (not shown) to the third plenum 131. FIG. 4 illustrates an enlarged top view of the gas injection insert 124. The gas injection insert 124 has a generally oblong shaped body. The gas injection insert 124 includes an oblong shaped baffle plate 122 disposed in the body of the gas injection insert 124. The gas injection insert 124 includes a plurality of apertures 126 (shown in phantom in FIG. 4). The gas injection insert 124 is configured to deliver the gas mixture from the first and second plenums 129, 120 through the apertures 126 into the interior volume 121 and to the substrate 140. The baffle plate 122 includes a plurality of apertures 117 formed therethrough. The baffle plate 122 is configured to deaden or slow the flow rate of the gas mixture flowing from the first and second plenums 129, 120 through the apertures 117 and evenly distribute the gas mixture to a third plenum 131 defined by the baffle plate 122 and the injection insert 124. Beneficially, the baffle plate 122 also reduces the overall gas mixture consumption by about 30 percent. Experimental results indicate that the velocity of the gas mixture may be reduced by about 98 percent. For example, the velocity of the gas mixture may be reduced from about 100 m/s (using a conventional showerhead design) to about 10 m/s (using the above described baffle plate 122) towards the substrate 140.

In one embodiment, the number of apertures 117 in the baffle plate 122 is between about 20 and about 30 apertures 117, for example, about 24 or about 25 apertures 117. In one embodiment, the apertures 117 are formed in a single column in the baffle plate 122. In one embodiment, the radius of the apertures 117 is between about 0.25 mm and about 1.52 mm, for example, about 0.793 mm. In one embodiment, the number of apertures 126 in the gas injection insert 124 is greater than the number of apertures 117 in the baffle plate 122.

In one embodiment, the apertures 126 in the gas injection insert 124 are formed in two columns. Each column may have between about 40 and about 60 apertures, for example, about 40 apertures or about 50 apertures, i.e., about 100 apertures. Therefore, in one embodiment, there are about 100 apertures 126 (50 apertures×two columns). In one embodiment, the apertures 117 and the apertures 126 are offset to create a tortuous flow path through the showerhead assembly 127. In one embodiment, the radius of the apertures 126 is between about 0.25 mm and about 1.52 mm, for example, about 0.79 mm. In another embodiment, (i) the number and size of the apertures 126; (ii) the number of columns having the apertures 126; and (iii) the thickness of the gas injection insert 124 itself, may be selected based on the flow rate of the gas mixture flowing from the first and second plenums 129, 120 (i.e., the inner zone 171 and the outer zone 172) to the third plenum 131, and finally flowing radially towards the substrate 140.

Figure 5:
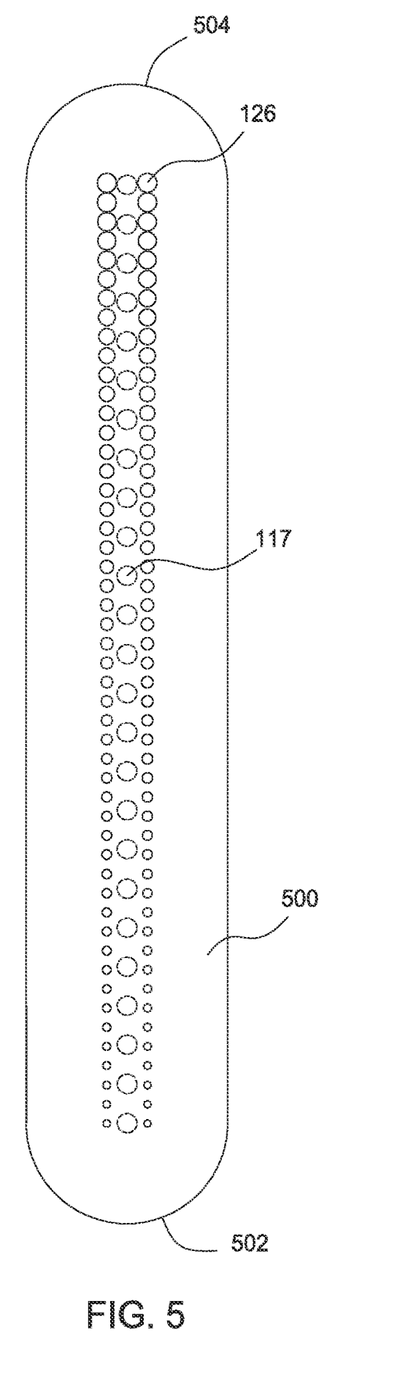
FIG. 5 illustrates an enlarged bottom view of a gas injection insert according to one embodiment of the disclosure.

FIG. 5 is an enlarged bottom view of a gas injection insert 500 having a plurality of apertures 126 varying in size. In one embodiment, the apertures 126 of the gas injection insert 500 vary in size to form a gas flow gradient. For example, the apertures 126 may have a larger surface area on one end of the gas injection insert 500 than an opposing end of the gas injection insert 500. In one embodiment, the apertures 126 are formed in two columns. Each column has about 50 apertures 126 (as shown in FIG. 5). The apertures 126 in each column increase gradually in size from a first end 502 of the gas injection insert 500 to an opposing second end 504 of the gas injection insert 500. In one embodiment, the apertures 126 increase from a radius of between about 0.34 mm to about 1.98 mm, for example, a radius of between about 0.44 mm to about 0.98 mm.

Referring to FIGS. 1 and 5, the gas injection insert 500 is disposed in the reflector plate 118, such that each column of about apertures 126, e.g., two columns having about 50 apertures 126 each, spans the length of both the first and second plenums 129, 120. As such, about a first half of the apertures 126 in each column, i.e., about 25 apertures 126, span the length of the first plenum 129 as part of the inner zone 171. The second half of the apertures 126 in each column, i.e., about 25 apertures 126, span the length of the second plenum 120 as part of the outer zone 172.

In one embodiment of operation, where deposition of the gas mixture may be higher at the center of the substrate 140 than the edges of the substrate 140, two separate volumetric flow rates of the gas mixture may be provided to the first and second gas injection ports 138, 128. For example, in one embodiment the overall gas mixture is provided at about 2 slm or about 5 slm through the showerhead assembly 127.

In one embodiment, the gas mixture flowing through the first plenum 129 has a slower flow rate than the gas mixture flowing through the second plenum 120 in order reduce the center-high deposition on the substrate 140. For example, the gas mixture is provided through the first gas injection port 138 and into the first plenum 129 at about 0.69 slm or about 1.71 slm (i.e., the inner zone 171). The gas mixture is then provided through the second gas injection port 128 and into the second plenum 120 at about 1.31 slm or about 3.29 slm (i.e., the outer zone 172). Because the first plenum 129 is disposed closer to the center of the substrate 140 that the second plenum 120, the first end 502 of the gas injection insert 500 (having the smaller aperture 126 size) is disposed below the first plenum 129 to account for the center-high deposition on the substrate 140. Conversely, because the second plenum 120 is disposed closer to the edge of the substrate 140 than the first plenum 129, the second end 504 of the gas injection insert 500 (having the larger aperture 126 size) is disposed below the second plenum 120. As such, the overall gas mixture flow rate through the showerhead assembly 127 can advantageously be individually controlled and tuned through the above disclosed inner and outer zones 171, 172 to create an even gas mixture flow rate between the center and the edges of the substrate 140 and therefore promote overall uniform deposition over the substrate 140. While the foregoing is directed to embodiments of the present disclosure, other and further embodiments of the disclosure may be devised without departing from the basic scope thereof, and the scope thereof is determined by the claims that follow.

The invention claimed is:

1. A showerhead assembly, comprising:
   a reflector plate having at least one gas injection port disposed therethrough;
   a gas injection insert disposed in the reflector plate and having a plurality of apertures; and
   a baffle plate disposed in the gas injection insert and having a plurality of apertures, wherein a first plenum is defined between a first portion of the baffle plate and the reflector plate, wherein a second plenum is defined between a second portion of the baffle plate and the reflector plate, wherein the apertures in the gas injection insert are axially unaligned with the apertures in the baffle plate, and wherein a gas mixing plenum is defined between the baffle plate and the gas injection insert, the gas mixing plenum in fluid communication with the first plenum and the second plenum through the apertures in the baffle plate.

2. The showerhead assembly of claim 1, wherein the reflector plate further comprises:
   a second gas injection port disposed therethrough, the second gas injection port separated from the at least one gas injection port by a wall of the reflector plate.

3. The showerhead assembly of claim 1, wherein the first plenum is concentric with the second plenum.

4. The showerhead assembly of claim 1, wherein the plurality of apertures in the gas injection insert is linearly arranged.

5. The showerhead assembly of claim 4, wherein a diameter of the apertures in the gas injection insert increases from a first end of the gas injection insert to a second end of the gas injection insert.

6. The showerhead assembly of claim 1, wherein the apertures of the plurality of apertures in the gas injection insert are greater in number than the apertures of the plurality of apertures in the baffle plate.

7. A showerhead assembly, comprising:
- a reflector plate having a first gas injection port and a second gas injection port disposed therethrough to deliver gas to a first plenum and a second plenum;
- a gas injection insert disposed in the reflector plate, disposed below the first and second plenums, wherein the gas injection insert includes a plurality of apertures, and wherein the number and size of the apertures are selected based on a flow rate of gas flowing through the first and second gas injection ports; and
- a baffle plate disposed in the gas injection insert and in fluid communication with the first and second plenums, wherein the baffle plate has a plurality of apertures defined therethrough, wherein the apertures in the gas injection insert are axially unaligned with the apertures in the baffle plate, and wherein a gas mixing plenum formed between the baffle plate and the gas injection insert, the gas mixing plenum in fluid communication with the first plenum and the second plenum through the apertures in the baffle plate.

8. The showerhead assembly of claim 7, wherein the baffle plate is disposed radially about a center of the reflector plate.

9. The showerhead assembly of claim 7, wherein the plurality of apertures in the baffle plate is linearly arranged.

10. The showerhead assembly of claim 7, wherein a diameter of the apertures in the gas injection insert increases from a first end of the gas injection insert to a second end of the gas injection insert.

11. The showerhead assembly of claim 7, wherein the apertures of the plurality of apertures in the gas injection insert are greater in number than the apertures of the plurality of apertures in the baffle plate.

* * * * *